United States Patent [19]

Katoh et al.

[11] Patent Number: 5,672,460

[45] Date of Patent: Sep. 30, 1997

[54] METHOD FOR FORMING CONDUCTIVE OR INSULATING LAYERS

[75] Inventors: Toshihiro Katoh; Takao Kuriyama; Tatsuya Takei; Takashi Kawai; Hiroshi Murakami; Eiji Munemoto; Norio Ohta; Koji Shimada, all of Tokyo-To, Japan

[73] Assignees: Nippon Hoso Kyokai; Dai Nippon Printing Co., Ltd., both of Japan

[21] Appl. No.: 480,608

[22] Filed: Jun. 8, 1995

[30] Foreign Application Priority Data

Jun. 10, 1994 [JP] Japan ................................. 6-151740

[51] Int. Cl.⁶ ....................................................... G03C 11/00
[52] U.S. Cl. ........................... 430/198; 430/157; 430/163; 430/332
[58] Field of Search ................................. 430/198, 163, 430/157, 68, 84, 322, 325, 330

[56] References Cited

U.S. PATENT DOCUMENTS

| | | | |
|---|---|---|---|
| 4,590,148 | 5/1986 | Takahashi et al. | 430/303 |
| 4,598,037 | 7/1986 | Felten | 430/281 |
| 5,009,972 | 4/1991 | Higuchi et al. | 430/7 |
| 5,286,269 | 2/1994 | Paschke et al. | 65/18.1 |

*Primary Examiner*—Thorl Chea
*Attorney, Agent, or Firm*—Parkhurst, Wendel & Burr, L.L.P.

[57] ABSTRACT

The present invention aims to solve problems involved in the formation of a conductive or insulating layer in a pattern form by photolithography, i.e., an environmental problem associated with handling a solvent and a problem associated with wastewater treatment in the development with an aqueous alkaline solution. A method for forming a conductive layer (an anode bus 3) or an insulating layer (a barrier 1) on a glass substrate by photolithography using a photosensitive slurry solution prepared by mixing a low-melting glass powder as a binder and a conductive or insulating powder into a PVA-based, water-soluble photosensitive solution, wherein the content of $B_2O_3$ component in the whole low-melting glass powder is closely regulated to not more than 6% by weight. This enables coating without gelation of PVA. Unlike the conventional photolithography using a solvent type photosensitive slurry, the method of the present invention can solve the environmental problem associated with handling a solvent and the problem associated with wastewater treatment in the development with an aqueous alkaline solution.

9 Claims, 1 Drawing Sheet

METHOD FOR FORMING CONDUCTIVE OR INSULATING LAYERS

BACKGROUND OF THE INVENTION

The present invention relates to a technique which can be applied mainly to a self-luminescent gas discharge display panel comprising a glass substrate bearing a conductive layer and an insulating layer and, further, to a thermal head comprising glass having a conductive layer and a heater used in a rear window of automobiles. More particularly, the present invention relates to a method for forming a conductive or insulating layer in a pattern form on a glass substrate by photolithography.

The present invention will now be described by taking a DC-type gas discharge display panel as an example.

FIG. 1 is an embodiment of the construction of a DC-type plasma display panel (hereinafter referred to as "PDP"). In the DC-type PDP, a flat front plate (not shown) and a back plate (not shown) each formed of an insulating material, such as glass, are provided parallel to and so as to face each other. A barrier 1 is fixed on the inner side of the back plate in a direction orthogonal to the back plate. This barrier 1 serves to provide a certain gap between the front plate and the back plate. A cathode 2 is formed on the inner side of the front plate. On the other hand, an anode bus 3 and a resistor 4 are provided on the inner side of the back plate in a direction orthogonal to the cathode 2. Further, a pad 5 is provided on the resistor 4, and a fluorescent screen 6 is provided adjacent to the side face of the pad 5. The anode bus 3 is generally formed of gold or silver, the resistor 4 is generally formed of ruthenium, and the cathode 2 is generally formed of nickel or the like.

In the DC-type PDP having the above construction, the application of a predetermined voltage from a direct current power supply across the pad 5 and the cathode 2 creates an electric field, causing discharge within each discharge cell 7 defined by the front plate, the back plate, and the barrier 1. The discharge produces ultraviolet light which renders the fluorescent screen 6 luminous, and a viewer perceives the light passing through the front plate.

Screen printing is known as a method for forming an anode bus 3 and a barrier 1 on a back plate of PDP having a structure shown in FIG. 1. Another method known in the art is photolithography wherein a low-melting glass powder and a conductive or insulating powder are added to a photosensitive solution using an organic solvent as a solvent system to prepare a photosensitive slurry which is then coated on a glass substrate, dried, exposed, and developed with an aqueous alkaline solution to form a desired pattern. Further, as a method for forming the anode bus 3, a technique is known wherein a conductive paste is screen-printed to provide a solid print which is fired and then etched.

In an attempt to increase the size and fineness in PDP, the possible finest anode bus and barrier attained by the conventional screen printing are about 100 µm in width. Further, the conventional method has a problem that elongation and strain in a screen plate render the pattern inaccurate. This problem brings about a local difference in resistance between the anode bus and the pad, resulting in uneven discharge characteristics. On the other hand, the technique where an anode bus is formed by etching suffers from a complicated production process and, in addition, poses a problem of wastewater treatment involved in the etching.

In view of the above problems, photolithography is considered suitable for the formation of a conductive or insulating layer. The above conventional photolithography involves an environmental problem, which unavoidably occurs in handling a solvent, and a problem of wastewater treatment associated with the development with an aqueous alkaline solution.

DISCLOSURE OF THE INVENTION

The present invention aims to eliminate the above problems of the prior art, and an object of the present invention is to provide a method for forming a conductive or insulating layer, which can solve all the problems involved in the formation of a conductive or insulating layer in a pattern form on a glass substrate by the conventional photolithography, that is, an environmental problem, which unavoidably occurs in handling a solvent, and a problem of wastewater treatment associated with the development with an aqueous alkaline solution.

In order to attain the above object, the method for forming a conductive or insulating layer according to the present invention comprises the steps of: coating a substrate with a photosensitive slurry comprising a mixture of a polyvinyl alcohol(PVA)-based, water-soluble photosensitive solution with a low-melting glass powder as a binder and a conductive or insulating powder; drying the resultant coating; subjecting the dried coating to exposure and development with water; and firing the developed coating to form a conductive or insulating layer in a desired pattern form on the substrate, said low-melting glass powder having a content of $B_2O_3$ as a component thereof of not more than 6% by weight based on the whole low-melting glass powder.

BEST MODE FOR CARRYING OUT THE INVENTION

Figure 1:
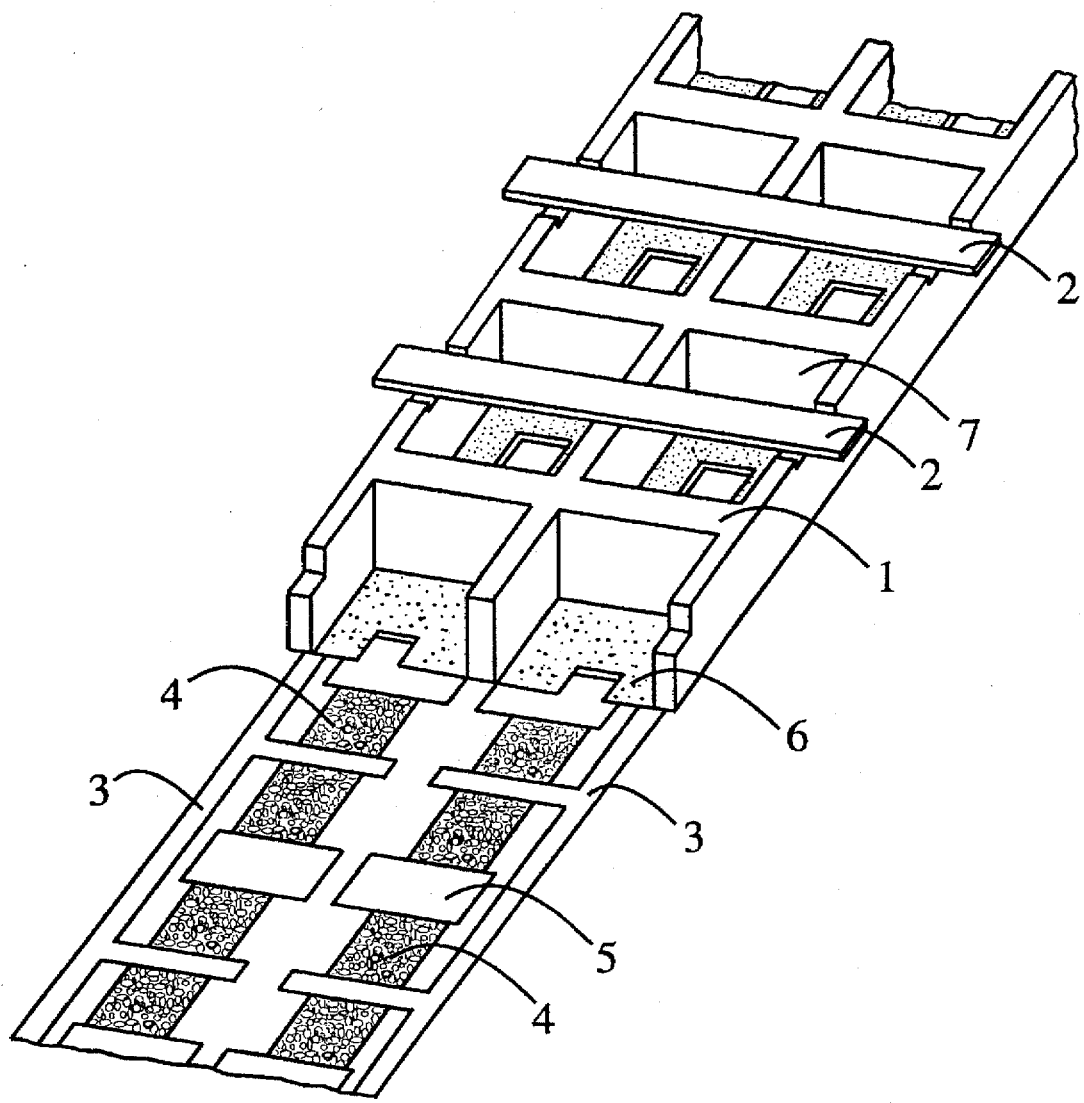
FIG. 1 is a typical view of an embodiment of the construction of a DC-type plasma display panel as a gas discharge display panel.

The method for forming the conductive layer/insulating layer according to the present invention comprises the steps of: coating a substrate with a photosensitive slurry comprising a mixture of a polyvinyl alcohol(PVA)-based, water-soluble photosensitive solution with a low-melting glass powder as a binder and a conductive or insulating powder; drying the resultant coating; subjecting the dried coating to exposure and development with water; and firing the developed coating to form a conductive or insulating layer in a desired pattern form on the substrate, said low-melting glass powder having a content of $B_2O_3$ as a component thereof of not more than 6% by weight based on the whole low-melting glass powder.

The present inventors have aimed at the use of a photosensitive slurry comprising a mixture of a PVA-based water-soluble photosensitive solution with a low-melting glass powder as a binder and a conductive or insulating powder with a view to developing a photolithographic process which can eliminate the need to use a solvent-type photosensitive solution and render the wastewater from the development step harmless, and have made extensive and intensive studies. As a result, they have found the following facts.

Specifically, in the preparation of a photosensitive slurry by adding a low-melting glass powder and a conductive or insulating powder to a photosensitive solution composed mainly of PVA, the use of a powder having a content of $B_2O_3$ as a component of 10% by weight (for example, OC-535 manufactured by Okuno Chemical Co., Ltd.) as the low-melting glass powder results in gelation of PVA, making it impossible to use the photosensitive slurry. By contrast, it was found that a glass powder having a $B_2O_3$ content of 4% by weight (for example, OC-200 and Z-7000 manufactured by Okuno Chemical Co., Ltd.) can provide a good photosensitive slurry without gelation of PVA.

The present inventors have made further studies based on this finding and, as a result, have found that the gelation is significantly reduced in a critical manner with a $B_2O_3$ content of the low-melting glass powder of 6% by weight as the border. Although the reason why the gelation occurs has not been fully elucidated yet, it is believed to reside in that the $B_2O_3$ component, which has been eluted from the low-melting glass powder into the photosensitive solution, or the $B_2O_3$ component present on the surface of the powder particles is reacted with PVA, causing gelation. For example, the formation of a water-insoluble resin coating on the surface of the glass particles for the purpose of inhibiting the elution of the $B_2O_3$ component is effective for preventing such gelation of the aqueous PVA solution. The formation of such coating on the surface of the glass particles complicates the production process and, in addition, is disadvantageous also from the viewpoint of cost.

The present invention has been made based on the above results of studies and is characterized in that the above problems have been eliminated by closely regulating the content of the $B_2O_3$ component in the low-melting glass powder to not more than 6% by weight based on the whole low-melting glass powder.

In the method for forming a conductive or insulating layer according to the present invention having the above constitution, a photosensitive slurry which causes no gelation reaction derived from a low-melting glass powder as a binder mixed into the aqueous PVA-based solution can be provided, and the formation of a pattern by photolithography is carried out using this photosensitive slurry of non-organic solvent type. Further, since water is used as a solvent in the step of development, unlike the conventional method, no problem of wastewater treatment occurs.

As described above, in the present invention, in principle, water is used as the solvent, and no organic solvent is used.

In the present invention, a photosensitive solution having the following composition is used as the PVA-based, water-soluble photosensitive solution.

| | |
|---|---|
| PVA | 0.5 to 20% by weight |
| Water | 76 to 99.47% by weight |
| Photosensitizing agent | 0.03 to 4% by weight |

Specific preferred examples of the sensitizing agent include diazo compounds and ammonium bichromate.

The low-melting glass powder composition as a binder to be mixed into the aqueous PVA-based solution may be the same composition as commonly used as a low-melting glass powder except that the content of the $B_2O_3$ is strictly limited to the above content range. Specific preferred examples thereof include $SiO_2$, $Al_2O_3$, and PbO.

The particle diameter of the glass powder is preferably in the range of from about 2 to 7 μm.

In the present invention, the content of the $B_2O_3$ component in the low-melting glass powder is limited to not more than 6% by weight, preferably not more than 5% by weight, still preferably not more than 4% by weight.

When the content of the $B_2O_3$ component exceeds 6% by weight, the resultant photosensitive slurry gels, making it difficult to form a uniform coating. Further, in the present invention, $B_2O_3$ is a component which is substantially effective for preparing low-melting glass and generally present in an amount of preferably not less than 1% by weight.

The amount of the low-melting glass powder incorporated is preferably 0.2 to 30% by weight based on the total amount of the photosensitive slurry.

Preferred conductive materials for forming the conductive layer include Au, Ag, $RuO_2$, ITO, Al, Ti, Cr, Fe, Ni, Cu, Zr, Nb, Mo, Pb, Ta and W. When the conductive material is used as an electrode, Au, Ag, $RuO_2$, and ITO (Indium-Tin Oxide) are particularly preferred.

Preferred insulating materials for forming the insulating layer include alumina, high-melting glass powders, and various pigments.

The kind and the amount of these materials may be properly selected according to the applications.

The photosensitive slurry thus prepared is coated on a substrate, such as glass, and the resultant coating is then dried, subjected to pattern-wise exposure, developed with water, and fired to prepare a substrate bearing a conductive or insulating layer in a desired pattern form.

The substrate having a conductive pattern or the substrate having an insulating pattern thus prepared is applicable to a discharge display panel, a thermal head, a rear window and the like according to contemplated applications.

EXAMPLE 1

The present example demonstrates the formation of a conductive layer. Specifically, the formation of an anode bus comprising a gold electrode in a DC-type PDP shown in FIG. 1 will now be described.

At the outset, a solution having the following composition was prepared as a photosensitive slurry.

| | (wt %) |
|---|---|
| Low-melting glass powder | 0.60 |
| Gold powder | 11.40 |
| PVA | 0.95 |
| Photosensitizing agent | 0.15 |
| Deionized water | 86.90 |

The low-melting glass powder was Z-7000 ($B_2O_3$ content: 4%) manufactured by Okuno Chemical Co., Ltd., PVA was PVA224 manufactured by Kuraray Co., Ltd., and the photosensitizing agent was a diazo compound. In the resultant slurry, no gelation of PVA was observed, and the low-melting glass powder and the gold powder were in an evenly dispersed state.

Then, in order to make the above photosensitive slurry coatable on a glass substrate by means of a blade coater, a thickening agent (for example, Metlose (90SH-4000) manufactured by The Shin-Etsu Chemical Co., Ltd.) is added to the photosensitive slurry to adjust the viscosity. The photosensitive slurry is then coated on a glass substrate by means of a blade coater, and the resultant coating was dried to form a 10 μm-thick dried coating. Coating may be carried out by any method so far as an even coating can be formed on a glass substrate. Subsequently, the sample thus obtained was exposed to ultraviolet light through an exposure mask and developed with water to provide a desired electrode pattern. It was then fired at about 580° C. to bake the pattern on the glass substrate, thereby forming an anode bus comprising a gold electrode.

EXAMPLE 2

The present example demonstrates the formation of an insulating layer. Specifically, the formation of a barrier in a DC-type PDP shown in FIG. 1 will now be described.

At the outset, a solution having the following composition was prepared as the photosensitive slurry.

|  | (wt %) |
| --- | --- |
| Low-melting glass powder | 10.20 |
| Alumina powder | 1.80 |
| PVA | 0.95 |
| Photosensitizing agent | 0.15 |
| Deionized water | 86.90 |

All the materials except for the alumina powder were the same as those used in Example 1. The alumina powder particles used were spherical and had a diameter of about 5 μm. In the resultant slurry, no gelation of PVA was observed, and the low-melting glass powder and the alumina powder were in an evenly dispersed state.

The viscosity of the above photosensitive slurry was regulated in the same manner as in Example 1 and coated by means of a blade coater, and the resultant coating was dried and exposed to ultraviolet light through an exposure mask. The above series of steps of coating, drying, and exposure were repeated to provide a desired coating thickness, and development with water was carried out at one time. Firing was then carried out to form a barrier having a height of 200 μm.

Although the formation of an anode bus (a conductive layer) and a barrier (an insulating layer) has been described above by taking DC-type PDP as an example, the present invention is applicable also to all the other types of PDP and, further, to a thermal head comprising glass having a conductive layer and a heater used in a rear window of automobiles.

EXAMPLE 3

A low-melting glass powder (sample T101-6), having a $B_2O_3$ content of 6.0% by weight, prepared on an experimental basis was added to and mixed with a photosensitive solution composed mainly of PVA in the same manner as in Examples 1 and 2. In the resultant photosensitive slurry, no gelation of PVA was observed, and the low-melting glass powder and the gold powder or the alumina powder were in an evenly dispersed state.

COMPARATIVE EXAMPLE 1

In order to prepare a photosensitive slurry, the procedure of Examples 1 and 2 was repeated, except that a low-melting powder (OC-535, $B_2O_3$ content 10%, manufactured by Okuno Chemical Co., Ltd.) was used. As a result, PVA gelled, making it impossible to prepare a photosensitive slurry.

COMPARATIVE EXAMPLE 2

In order to prepare a photosensitive slurry, the procedure of the examples was repeated, except that a low-melting powder (F-01, $B_2O_3$ content 13%, manufactured by Okuno Chemical Co., Ltd.) was used. As a result, PVA gelled, making it impossible to prepare a photosensitive slurry.

COMPARATIVE EXAMPLE 3

A low-melting glass powder (sample T101-65), having a $B_2O_3$ content of 6.5% by weight, prepared on an experimental basis was added to and mixed with a photosensitive solution composed mainly of PVA in the same manner as in Examples 1 and 2. As a result, PVA gelled, making it impossible to prepare a photosensitive slurry.

As described above, according to the present invention, a conductive or insulating layer in a pattern form is formed by photolithography using a photosensitive slurry of non-organic solvent type, and, further, water rather than an aqueous alkaline solution is used in the step of development. Therefore, unlike the conventional photolithography using a photosensitive slurry of organic solvent type, the present invention can solve an environmental problem associated with handling a solvent and a problem of wastewater treatment associated with the development with an aqueous alkaline solution. Further, the method of the present invention has better suitability for a large-size/high-fine substrate than the conventional screen printing and, further, as compared with the conventional method wherein an electrode is formed by patterning using etching, can simplify the production process and eliminate the problem of wastewater treatment involved in the etching.

We claim:

1. A method for forming a patterned layer, comprising the steps of:

coating a substrate with a photosensitive slurry to form a coating layer, said photosensitive slurry comprising a mixture of (i) a polyvinyl alcohol-based, water-soluble photosensitive solution, (ii) a low-melting glass powder as a binder, and (iii) one of a conductive powder and an insulating powder, said low-melting glass powder having a content of $B_2O_3$ as a component thereof of not more than 6% by weight based on the total amount of low-melting glass powder in said mixture;

drying the coating layer to form a dried coating layer;

subjecting the dried coating layer to exposure and development with water to form a developed coating layer; and firing the developed coating layer to form the patterned layer on the substrate.

2. The method according to claim 1, wherein the photosensitive slurry is essentially free from an organic solvent.

3. The method according to claim 1, wherein the substrate is a glass substrate.

4. The method according to claim 1, wherein the conductive powder comprises at least one member selected from the group consisting of Au, Ag, $RuO_2$, ITO, Al, Ti, Cr, Fe, Ni, Cu, Zr, Nb, Mo, Pb, Ta and W.

5. The method according to claim 1, wherein the insulating powder comprises at least one of alumina, a high-melting glass powder, and a pigment.

6. The method according to claim 1, wherein the low-melting glass powder comprises $SiO_2$, PbO and $Al_2O_3$.

7. The method according to claim 1, wherein the polyvinyl alcohol-based, water-soluble photosensitive solution comprises one of a diazo compound and ammonium bichromate as a sensitizing agent.

8. The method according to claim 1, wherein the $B_2O_3$ content is not more than 5% by weight based on the total amount of low-melting glass powder.

9. The method according to claim 1, wherein the development with water is carried out using a developer essentially free from an alkali component.

* * * * *